(12) United States Patent
Komatsu et al.

(10) Patent No.: US 8,704,261 B2
(45) Date of Patent: Apr. 22, 2014

(54) LIGHT EMITTING MODULE

(71) Applicant: Koito Manufacturing Co., Ltd., Tokyo (JP)

(72) Inventors: Takaaki Komatsu, Shizouka (JP); Yasuaki Tsutsumi, Shizouka (JP); Hisayoshi Daicho, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 13/724,991

(22) Filed: Dec. 21, 2012

(65) Prior Publication Data

US 2013/0105850 A1 May 2, 2013

Related U.S. Application Data

(63) Continuation of application No. PCT/JP2011/004187, filed on Jul. 25, 2011.

(30) Foreign Application Priority Data

Jul. 26, 2010 (JP) .................................. 2010-167398
Jun. 3, 2011 (WO) .................. PCT/JP2011/003155

(51) Int. Cl.
*H01L 33/50* (2010.01)

(52) U.S. Cl.
USPC .......................................................... 257/98

(58) Field of Classification Search
CPC ....................................................... H01L 33/50
USPC .......................................................... 257/98
See application file for complete search history.

(56) References Cited

U.S. PATENT DOCUMENTS

2005/0221519 A1 * 10/2005 Leung et al. .................... 438/27

FOREIGN PATENT DOCUMENTS

| JP | 2006237264 A | 9/2006 |
| JP | 2007109946 A | 4/2007 |
| JP | 2008235827 A | 10/2008 |
| JP | 2008270707 A | 11/2008 |
| JP | 2009105379 A | 5/2009 |
| WO | 2010044239 A1 | 4/2010 |

OTHER PUBLICATIONS

Index of Refraction of Quartz The Physics Factbook (2005).*
International Preliminary Report on Patentability, Feb. 12, 2013, 11 pages.
International Search Report, Oct. 11, 2011, 5 pages.
JPO, International Search Report from priority application PCT/JP2011/003155 dated Sep. 6, 2011.
JPO, International Preliminary Report on Patentability from priority application PCT/JP2011/003155 dated Feb. 12, 2013.

* cited by examiner

*Primary Examiner* — Walter H Swanson
(74) *Attorney, Agent, or Firm* — Buchanan Ingersoll Rooney PC

(57) ABSTRACT

A light emitting module includes: an LED chip; a plate-shaped phosphor layer that is provided so as to face the light emitting surface of the LED chip and is configured to convert the wavelength of the light emitted by the LED chip; and a filter layer that is formed, of the surfaces of the phosphor layer, on at least one of the surface that faces the LED chip and the side surface, and that is configured to transmit the light emitted from the LED chip and to reflect the light whose wavelength has been converted by the phosphor layer. The filter layer is formed such that a ratio of the energy of the emitted light within a range of ±60° with respect to the front direction to the total energy of emitted light is 80% or more.

13 Claims, 13 Drawing Sheets

LIGHT EMITTING MODULE

CROSS-REFERENCE TO RELATED APPLICATIONS

This application is based upon and claims the benefit of priority from the prior Japanese Patent Application No. 2010-167398 filed on Jul. 26, 2010, International Patent Application No. PCT/JP 2011/003155, filed on Jun. 3, 2011, and International Patent Application No. PCT/JP 2011/004187, filed on Jul. 25, 2011, the entire content of each of which is incorporated herein by reference.

BACKGROUND OF THE INVENTION

1. Field of the Invention

The present invention relates to a light emitting module including a light emitting element, such as a light emitting diode.

2. Description of the Invention

In recent years, LEDs (Light Emitting Diodes) by which power saving can be expected draw attentions as light sources for lighting apparatuses from growing interests in environment. A structure in which an LED chip and a phosphor are combined together is known as a lighting apparatus using an LED, which emits white light.

In such a structure, because the light from the LED chip is emitted in all directions after the wavelength thereof has been converted by the phosphor, part of the light whose wavelength has been converted returns again toward the LED chip to be absorbed there, and disappears after turning into heat. As a result, an efficiency of extracting light from the LED chip is decreased.

Accordingly, a light emitting apparatus including a wavelength-selective filter layer has been devised, in which the wavelength-selective filter layer transmits the light emitted from an LED chip and reflects the visible light emitted from a phosphor (see Japanese Patent Application Publication Nos. 2008-270707 and 2008-235827). Thereby, it is said that absorption of part of the visible light emitted from the phosphor, occurring when the part of the visible light returns to the LED chip, can be suppressed and a decrease in a light extraction efficiency can be prevented.

However, in the light emitting apparatus described in the aforementioned Patent Document 1, there is an air layer between the LED chip and the wavelength-selective filter layer, and the difference between the refractive index of the LED chip and that of air is large, and hence the light in the LED chip is likely to be confined therein. As a result, an amount of the extracted light is small, and hence the light emitting apparatus cannot be one having a high luminance. In addition, in another embodiment in which the LED chip is covered with glass, the surface area of a light emitting layer becomes large, and hence the light emitting apparatus cannot be one having a high luminance. In the light emitting apparatus described in Patent Document 2, a sealing resin is present between the LED chip and the wavelength-selective filter layer, and hence an efficiency of extracting light from the LED chip is improved. On the other hand, in a light emitting apparatus having a sealing resin, an angle (incident angle) at which the light from the LED chip is incident on the wavelength-selective filter layer has a great influence on the transmittance of the wavelength-selective filter layer in comparison with the case where there is no sealing resin. In particular, as the incident angle is larger, the transmittance of light is more decreased. As a result, the light emitting apparatus cannot be one having a high luminance. In addition, in the light emitting apparatus described in Patent Document 2, the thickness of the sealing resin is large, and hence the light from the LED chip spreads before reaching the filter layer and the light is absorbed by the sealing resin, thereby an improvement in the luminance is also hampered.

SUMMARY OF THE INVENTION

The present invention has been made in view of these situations, and a purpose of the invention is to provide a light emitting module having a high luminance.

In order to solve the aforementioned problem, a light emitting module according to an embodiment of the present invention comprises: a semiconductor light emitting element; a plate-shaped light wavelength conversion member that is provided so as to face the light emitting surface of the semiconductor light emitting element and is configured to convert the wavelength of the light emitted by the semiconductor light emitting element; and a filter layer that is formed, of the surfaces of the plate-shaped light wavelength conversion member, on at least one of the surface facing the semiconductor light emitting element and the side surface and is configured to transmit the light emitted from the semiconductor light emitting element and to reflect the light whose wavelength has been converted by the light wavelength conversion member. The semiconductor light emitting element is formed such that a ratio of the energy of the emitted light within a range of ±60° with respect to the front direction to the total energy of emitted light is 80% or more.

BRIEF DESCRIPTION OF THE DRAWINGS

Embodiments will now be described, by way of example only, with reference to the accompanying drawings, which are meant to be exemplary, not limiting, and wherein like elements are numbered alike in several figures, in which.

DETAILED DESCRIPTION OF THE INVENTION

Figure 1:
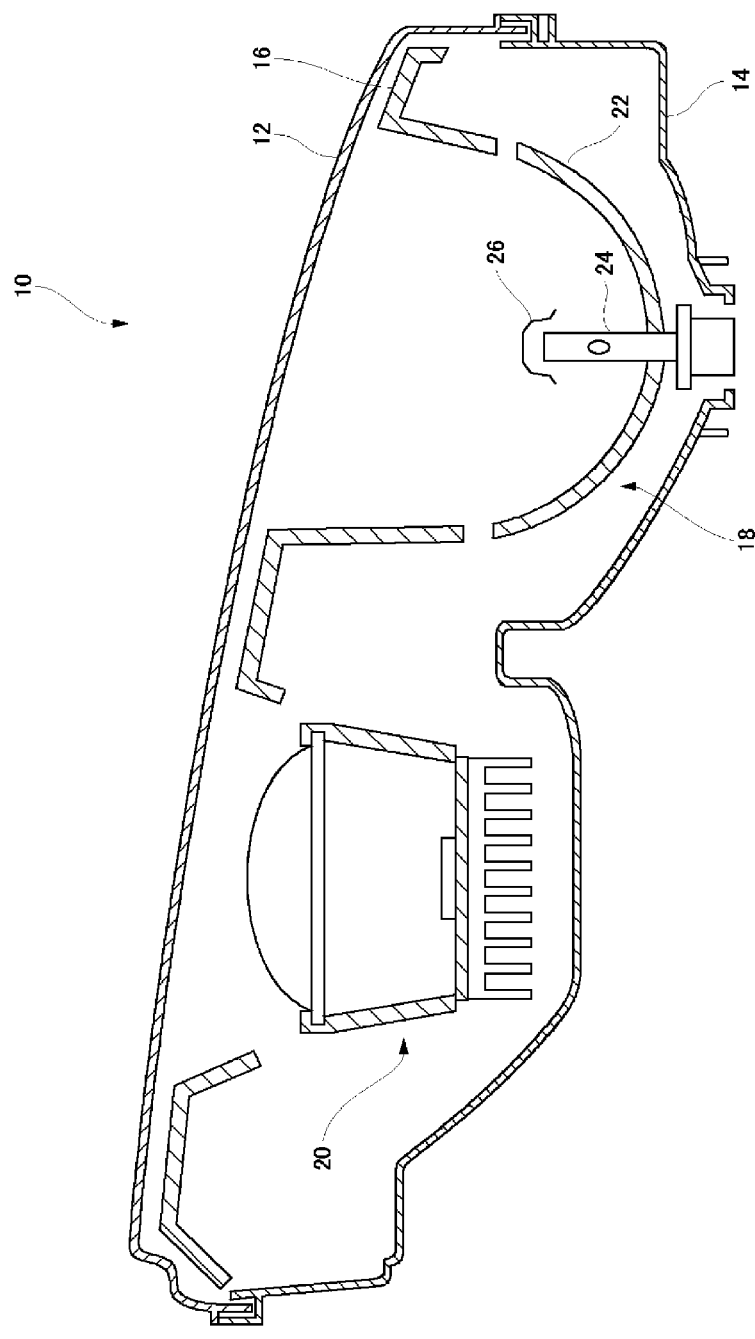
FIG. 1 is a schematic structural view of a lamp body unit that forms an automotive headlamp apparatus according to the present embodiment.

A light emitting module according to an embodiment of the present invention comprises: a semiconductor light emitting element; a plate-shaped light wavelength conversion member that is provided so as to face the light emitting surface of the semiconductor light emitting element and is configured to convert the wavelength of the light emitted by the semiconductor light emitting element; and a filter layer that is formed, of the surfaces of the plate-shaped light wavelength conversion member, on at least one of the surface facing the semiconductor light emitting element and the side surface and is configured to transmit the light emitted from the semiconductor light emitting element and to reflect the light whose wavelength has been converted by the light wavelength conversion member. The semiconductor light emitting element is formed such that a ratio of the energy of the emitted light within a range of ±60° with respect to the front direction to the total energy of emitted light is 80% or more.

According to this embodiment, by the filter layer, the light emitted from the semiconductor light emitting element is transmitted and the light whose wavelength has been converted by the light wavelength conversion member is reflected, and hence an efficiency of extracting the light travelling in the front direction is improved. Further, the light distribution of the semiconductor light emitting element concentrates relatively on the front and the light wavelength conversion member provided so as to face the light emitting surface of the semiconductor light emitting element is plate-shaped, and hence the emitted light emitted by the semiconductor light emitting element and the converted light whose wavelength has been converted by the light wavelength conversion member are both likely to travel in the front direction. Accordingly, the luminance in the front direction of the light emitting module can be enhanced.

The filter layer is formed, of the surfaces the light wavelength conversion member, on the surface that faces the semiconductor light emitting element, and the light emitting module may further include an adhesive layer that adheres the filter layer and the semiconductor light emitting element. The adhesive layer may contain a material having a refractive index of 1.3 or more. When the space between the filter layer and the semiconductor light emitting element is formed of an air layer, the difference between the refractive index of the air layer and that of the semiconductor light emitting element is relatively large, and hence there is room for improving an efficiency of extracting the light in the semiconductor light emitting element. Accordingly, by adhering the filter layer and the semiconductor light emitting element with the adhesive layer having a refractive index higher than that of air, an efficiency of extracting the light in the semiconductor light emitting element can be improved.

The thickness of the adhesive layer may be 0.1 μm to 100 μm. When the thickness of the adhesive layer is 0.1 μm or more, the filter layer and the semiconductor light emitting element can be adhered together. Further, when the thickness thereof is 100 μm or less, the light emitted by the semiconductor light emitting element can reach the side surface of the adhesive layer without spreading too much, and a decrease in the transmittance can also be suppressed.

The filter layer may be formed such that the transmittance, occurring when the light emitted by the semiconductor light emitting element is incident on the filter layer at an incident angle of 60°, is 80% or more. Thereby, it becomes possible to guide, to the light wavelength conversion member, most of the light emitted from the semiconductor light emitting element in the front direction.

At least part of the surface of the light wavelength conversion member, on which the filter layer is not formed, may have a concavo-convex shape. Thereby, an efficiency of extracting light from the light emitting surface of the light wavelength conversion member is improved.

The concavo-convex shape may be formed of a plurality of grooves, and the width of the groove may be 1 μm to 1000 μm and the depth thereof may be 1 μm to 1000 μm. Thereby, the efficiency of extracting light from the light emitting surface of the light wavelength conversion member is further improved.

The arithmetic average roughness Ra in at least part of the surface of the light wavelength conversion member, on which the filter layer is not formed, may be 100 nm to 1000 nm. Thereby, the efficiency of extracting light from the light emitting surface of the light wavelength conversion member is further improved.

When it is assumed that: the number of the semiconductor light emitting elements included in the light emitting module is N; the area of the light emitting surface of each of the semiconductor light emitting elements, the light emitting surface being located on the side that faces the filter layer, is S; and the area of the light incident surface of the light wavelength conversion member, the light incident surface being located on the side that faces the semiconductor light emitting element, is T, $S \leq T/N \leq 4 \times S$ may be satisfied. Thereby, the area of the light emitting surface of the light wavelength conversion member can be limited to be small, and the luminance in the front direction of the light emitting module can be enhanced.

The thickness of the light wavelength conversion member may be 1 μm to 1000 μm.

When it is assumed that: the wavelength of light, occurring when the transmittance becomes 50% in the case where light is incident on the filter layer at an incident angle of 0°, is λ1 [nm]; and the peak wavelength of the light emitted by the semiconductor light emitting element is λp [nm], the filter layer may be formed so as to satisfy $\lambda p \leq \lambda 1 \leq \lambda p + 200$ [nm]. If the wavelength λ1 of light, occurring when the transmittance becomes 50% in the case where light is incident on the filter layer at an incident angle of 0°, is smaller than the peak wavelength λp of the light emitted by the semiconductor light emitting element, most of the light emitted from the semiconductor light emitting element is not transmitted through the filter layer, and hence the light reaching the light wavelength conversion member is decreased. On the other hand, if the wavelength λ1 of light, occurring when the transmittance becomes 50%, is larger than λp+200 nm (wherein, λp: peak wavelength of the light emitted by the semiconductor light emitting element), the light travelling toward the filter layer, of the light whose wavelength has been converted by the light wavelength conversion member, is not sufficiently reflected by the filter layer, and hence the light that has not been reflected travels toward the semiconductor light emitting element as it is, and is turned into heat in the meantime. Accordingly, by forming the filter layer so as to satisfy $\lambda p \leq \lambda 1 \leq \lambda p + 200$ [nm], occurrence of the light that does not contribute to the light emission by the light emitting module and becomes a waste, can be suppressed.

Optional combinations of the aforementioned constituting elements and implementations of the invention in the form of methods, apparatuses, or systems may also be effective as additional modes of the present invention.

The invention will now be described by reference to the preferred embodiments. This does not intend to limit the scope of the present invention, but to exemplify the invention. Hereinafter, preferred embodiments for carrying out the present invention will be described in detail with reference to the accompanying drawings. In the description of the drawings, like elements will be denoted with like reference numerals and duplicative description will be appropriately omitted.

In recent years, the development of various lighting apparatuses using LEDs or LDs (Laser Diodes) is in progress. Some of such lighting apparatuses are required to have a high luminance as a property. For example, when a light emitting module in which an LED or LD is used as a light source is used in an automotive headlight, the light emitting module is required to have a further high luminance. Accordingly, as a result of intensive study to achieve a high luminance of a light emitting module, the present inventors have devised a light emitting module represented by the following embodiments.

[Automotive Headlamp Apparatus]

As an application in which a light emitting module according to each of the later-described embodiments is suitably used, the outline of an automotive headlamp apparatus required to have a high luminance will be first described. The automotive headlamp apparatus according to the present embodiment comprises: a lamp unit configured to emit light capable of forming a partial area of a light distribution pattern for high beam; and an emission controller configured to control an emission state of the light from the lamp unit. The emission controller controls an emission state of light such that a partial area of a light distribution pattern for high beam is formed by portion areas that are created by dividing, at least in the vehicle width direction, the partial area of a light distribution pattern for high beam into a plurality of areas. Also, the emission controller individually adjusts the light intensity of the emitted light corresponding to each of the partial areas in order to perform switching between a high beam emission mode and a daytime lighting emission mode, thereby allowing a light intensity distribution suitable for the high beam emission mode and that suitable for the daytime lighting emission mode to be formed. The light emitting module according to each embodiment can also be applied to a lamp unit that forms a light distribution pattern for low beam, without being limited to a lamp unit that forms a light distribution pattern for high beam.

FIG. 1 is a schematic structural view of a lamp body unit that forms an automotive headlamp apparatus according to the present embodiment. The automotive headlamp apparatus according to the embodiment includes a pair of lamp body units provided at both ends in the vehicle width direction in the front part of a vehicle. Emission as an automotive headlamp apparatus is completed by superimposing, one on another, both light distribution patterns in front of a vehicle, the both light distribution patterns having been emitted from the left and right lamp body units. FIG. 1 illustrates, of the left and right lamp body units, the structure of the lamp body unit 10 arranged on the right side. For easy understanding, FIG. 1 illustrates a section of the lamp body unit 10, which is obtained by cutting the lamp body unit 10 with a horizontal plane and viewing it from above. The lamp body unit arranged on the left side has a structure symmetrical to that of the lamp body unit 10 arranged on the right side, and the basic structures of them are the same as each other. Accordingly, the lamp body unit 10 arranged on the right side will be described and the description of that arranged on the left side will be omitted. Hereinafter, description will be sometimes made, assuming, for convenience, that the direction in which the light in the lamp unit is emitted is the vehicle front (front side) and the direction opposite to that is the vehicle rear (rear side).

The lamp body unit 10 includes a translucent cover 12, a lamp body 14, an extension 16, a first lamp unit 18, and a second lamp unit 20. The lamp body 14 is formed, by a resin, etc., into a cup-like shape having an elongated opening. The translucent cover 12 is formed by a resin having translucency and is attached to the lamp body 14 so as to block the opening in the lamp body 14. Thus, a lamp chamber, which is substantially a closed space, is formed by the lamp body 14 and the translucent cover 12, and the extension 16, the first lamp unit 18, and the second lamp unit 20 are arranged in the lamp chamber.

The extension 16 has an opening through which the light emitted from each of the first lamp unit 18 and the second lamp unit 20 passes, and is fixed to the lamp body 14. The first lamp unit 18 is arranged, in the vehicle width direction, outside the second lamp unit 20. The first lamp unit 18 is a so-called parabola-type lamp unit, and forms the later-described light distribution pattern for low beam.

The first lamp unit 18 has a reflector 22, a light source bulb 24, and a shade 26. The reflector 22 is formed into a cup-like shape, and an insertion hole is provided at the center. In the present embodiment, the light source bulb 24 is formed by an incandescent lamp having a filament, such as a halogen lamp. Alternatively, a light source of another type, such as an electric discharge lamp, may be adopted as the light source bulb 24. The light source bulb 24 is fixed to the reflector 22 by being inserted into the insertion hole of the reflector 22 so as to protrude inside. The internal curved surface of the reflector 22 is formed so as to reflect the light emitted by the light source bulb 24 toward the vehicle front. The shade 26 blocks the light travelling from the light source bulb 24 directly to the vehicle front. Because the structure of the first lamp unit 18 is publicly known, the detailed description thereof will be omitted. Alternatively, the later-described light emitting module may be used as a light source for the first lamp unit 18.

Figure 2:
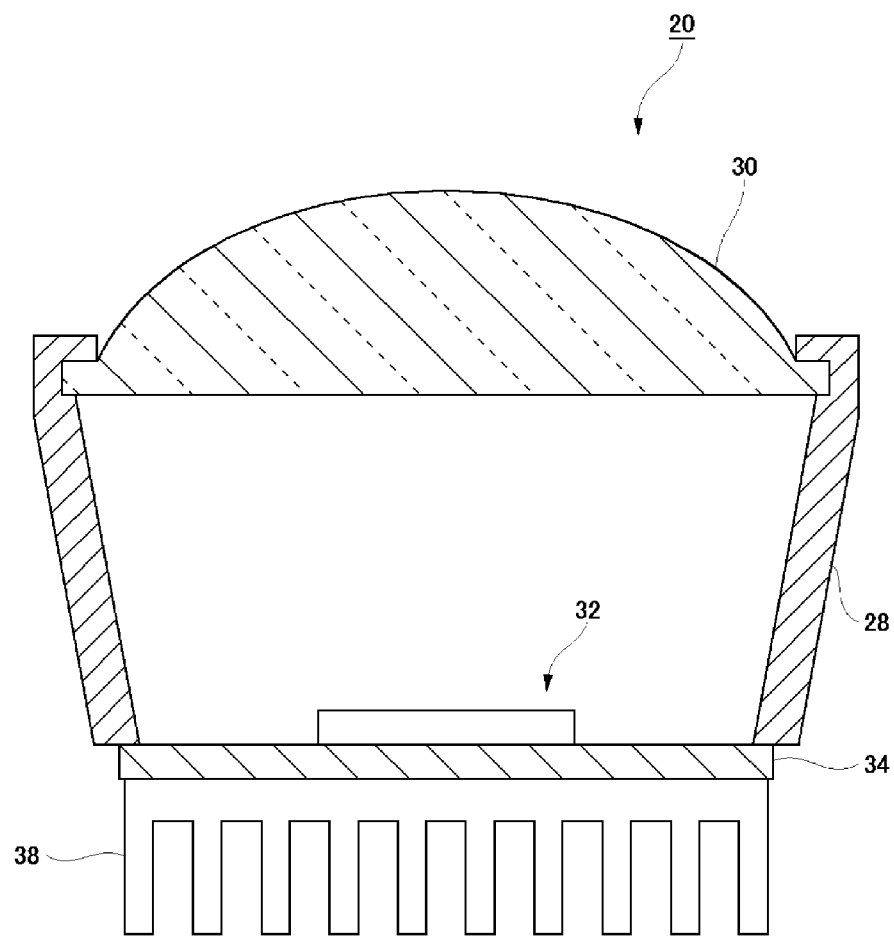
FIG. 2 is a view illustrating the structure of a second lamp unit included in the lamp body unit according to the present embodiment.

FIG. 2 is a view illustrating the structure of the second lamp unit 20 included in the lamp body unit 10 according to the present embodiment. FIG. 2 illustrates a section of the second lamp unit 20, which is obtained by cutting the second lamp unit 20 with a horizontal plane and viewing it from above. The second lamp unit 20 includes a holder 28, a projection lens 30, a light emitting module 32, and a heat sink 38. The second lamp unit 20 is one that emits light capable of forming all or a partial area of a light distribution pattern for high beam. That is, during a high beam emission mode, the second lamp unit 20 forms a light distribution pattern for high beam above a light distribution pattern for low beam formed by the first lamp unit 18. With the light distribution pattern for high beam being added to the light distribution pattern for low beam, an emission range is widened as a whole, and visibility for a distant area is also improved. Further, the second lamp unit 20 functions, by independently emitting light during a daytime lighting emission mode, as a daytime lighting emission lamp by which the presence of a driver's vehicle can be easily recognized, at daytime, etc., by an oncoming vehicle or a pedestrian, which is a so-called daytime running lamp (DRL).

The projection lens 30 is formed by a plano-convex aspheric lens, the front surface of which is convex-shaped and the back surface of which is flat-shaped, and projects, as an inverted image, a light source image that is formed on the back focal plane onto a virtual vertical screen in front of the lamp. The projection lens 30 is attached to one of the openings of the holder 28 formed into a tubular shape. In addition, the light emitting module 32 is one corresponding to a light emitting module according to each of the following embodiments.

(First Embodiment)
[Light Emitting Module]

Figure 3:
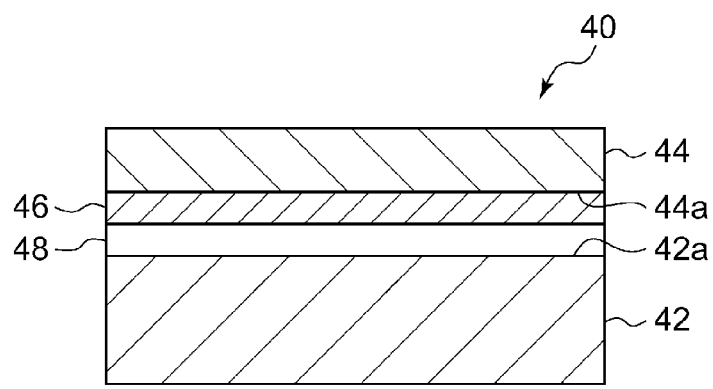
FIG. 3 is a sectional view illustrating an essential portion of a light emitting module according to First Embodiment.

FIG. 3 is a sectional view illustrating an essential portion of a light emitting module according to First Embodiment. A light emitting module 40 comprises: an LED chip 42 as a semiconductor light emitting element; a plate-shaped phosphor layer 44 that is provided so as to face the light emitting surface 42a of the LED chip 42 and is configured to convert the wavelength of the light emitted by the LED chip 42; and a filter layer 46 that is formed, of the surfaces of the plate-shaped phosphor layer 44, on the surface 44a that faces the LED chip 42 and that is configured to transmit the light emitted from the LED chip 42 and to reflect the light whose wavelength has been converted by the phosphor layer 44. In the light emitting module 40 according to the present embodiment, an air layer 48 is formed in the gap between the LED chip 42 and the filter layer 46.

Examples of the LED chip 42 include a flip-chip type LED to be mounted, with face down, on a non-illustrated mounting board, and a vertical LED, etc. The phosphor layer 44 functions as a light wavelength conversion member that emits the light emitted by the LED chip 42 faced by the phosphor layer 44 after converting the wavelength of the light.

Figure 4:
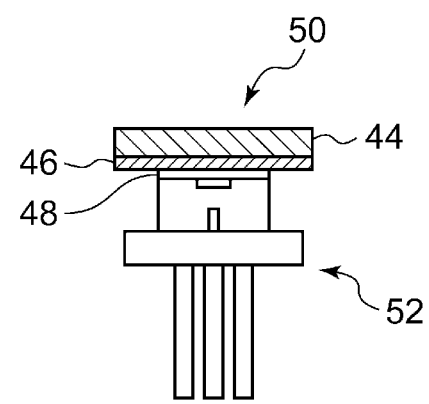
FIG. 4 is a sectional view illustrating an essential portion in a variation of the light emitting module according to First Embodiment.

FIG. 4 is a sectional view illustrating an essential portion in a variation of the light emitting module according to First Embodiment. A light emitting module 50 is the same as the aforementioned light emitting module 40, except that a CAN type LD 52 is used as a semiconductor light emitting element.

Figure 5:
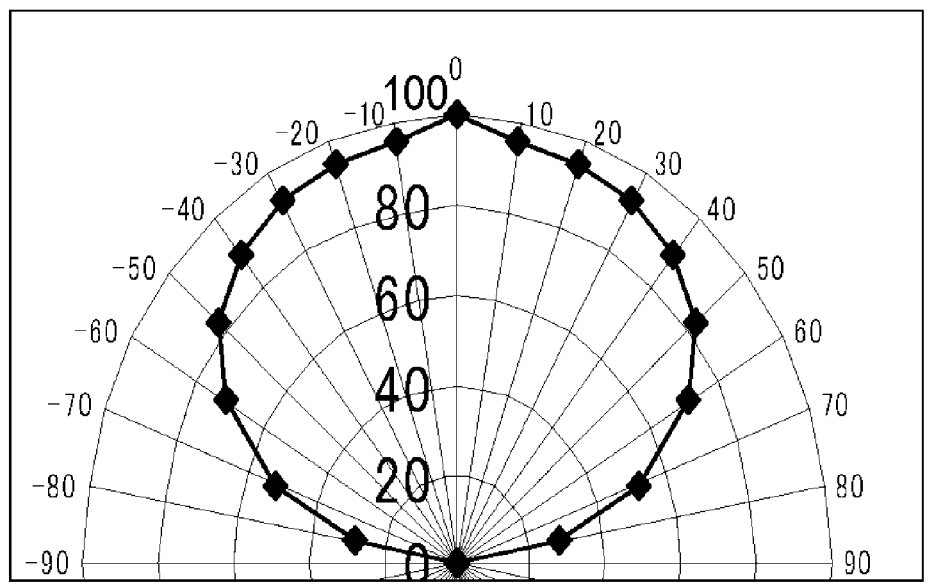
FIG. 5 is a view illustrating an example of the light distribution of an LED chip suitable in the present embodiment.
Figure 13:
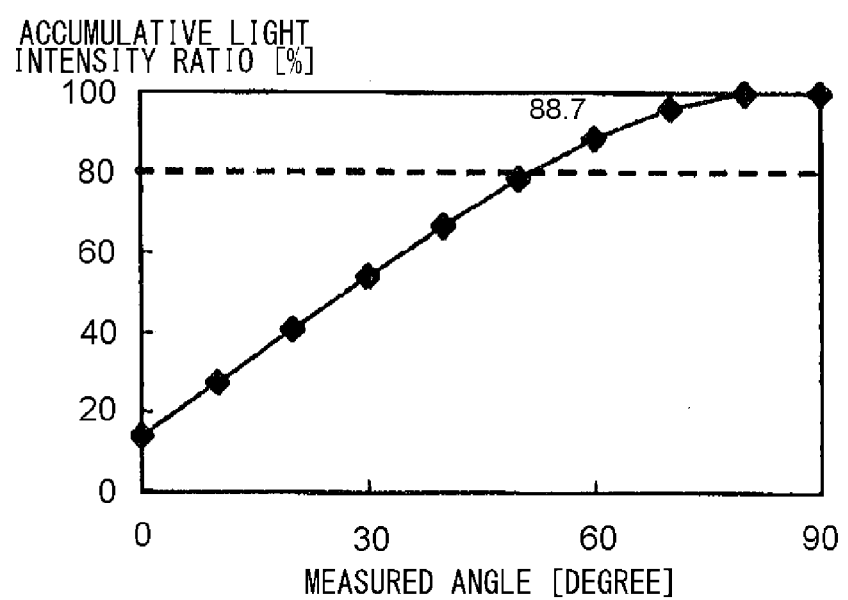
FIG. 13 is a graph illustrating the relationship between a measured angle and an accumulative light intensity ratio in the LED chip having the light distribution illustrated in FIG. 5.

FIG. 5 is a view illustrating an example of the light distribution of an LED chip suitable in the present embodiment. In FIG. 5, relative values, obtained when the light intensity in the front direction of the LED chip is assumed to be 100, are shown within an emission direction range of −90° to 90°. FIG. 13 is a graph illustrating the relationship between a measured angle and an accumulative light intensity ratio in the LED chip having the light distribution illustrated in FIG. 5. The accumulative light intensity ratio illustrated in FIG. 13 represents, when the sum of the light intensities, each of which is measured at an interval of 10° from the front direction of the LED chip (0°) to the just beside direction (90°), is assumed to be 100, the ratio of the accumulative value of the light intensities up to each measured angle. For example, when the light intensity at a measured angle x (10, 20, ... 80, 90) is assumed to be Ix, the accumulative light intensity ratio $R_{60}$ up to a measured angle of 60° is represented by the following expression:

$$R_{60}=(I_0+I_{10}+\ldots+I_{60})/(I_0+I_{10}+\ldots+I_{80}+I_{90})$$

In the LED chip according to the present embodiment, the accumulative light intensity ratio $R_{60}$ up to a measured angle of 60° is 88.7%, which is larger than 80%. Thus, the semiconductor light emitting element according to the embodiment is formed such that the ratio of the energy of the emitted light within a range of the front direction to ±60° to the total energy of emitted light is 80% or more.

Alternatively, the emission wavelength of the semiconductor light emitting element may be within the range of ultraviolet light, without being limited only to the range of visible light. In addition, because an amount of the light that is transmitted through the filter layer 46 becomes larger as the directivity of the semiconductor light emitting element is higher, an LD, a vertical LED, and a flip-chip type LED are preferable in this order from the viewpoint of enhancing the luminance of the light emitting module.

[Light Wavelength Conversion Member]

Examples of the material to be used for the light wavelength conversion member include a resin composition, a glass composition, and the later-described fluorescent ceramic, in each of which powder phosphors are dispersed. In particular, fluorescent ceramic, which is an inorganic material, can be easily formed into various shapes and easily subjected to highly precise processing. Accordingly, fluorescent ceramic is preferable particularly when used as a plate-shaped light wavelength conversion member. The ceramic formed of phosphors (phosphor sintered body) is what is referred to as so-called luminescent ceramic or fluorescent ceramic, and can be obtained by sintering ceramic green body made of YAG (Yttrium Aluminum Garnet) powders that are phosphors to be excited by blue light. Because a method of manufacturing such light wavelength conversion ceramic is publicly known, detailed descriptions thereof will be omitted. In the light wavelength conversion ceramic thus obtained, light diffusion on the surface of a powder can be suppressed and a loss of the light emitted by the semiconductor light emitting element is very small, unlike, for example, a powder phosphor. Alternatively, the phosphor to be sintered is not limited to a phosphor to be excited by blue light, but may be one to be excited by, for example, near-ultraviolet light or ultraviolet light.

The thickness of the light wavelength conversion member may be appropriately set in view of the color and luminance of light, which are required as the light emitting module, and the type of an LED chip to be combined. For example, when the thickness is 1 μm or more, it becomes possible to sufficiently convert the wavelength of the light emitted by the LED chip. Further, when the thickness is 1000 μm or less, the light from the LED chip can be sufficiently transmitted.

It is preferable that the refractive index of the light wavelength conversion member is 1.2 to 3.0. The light wavelength conversion member may be formed of a single component or multiple components, but only has to be plate-shaped.

Examples of the light wavelength conversion member include, for example: (i) a plate-shaped article formed of a mixture of a thermosetting resin, such as a silicone resin, epoxy resin, urethane resin, or the like, and a phosphor; (ii) a plate-shaped article formed of a mixture of a thermoplastic resin, such as an acrylic resin, polycarbonate, polyolefin, polystyrene, cycloolefin, PVC, or the like, and a phosphor; (iiia) a plate-shaped article formed of a mixture of a transparent inorganic substance, such as fused silica, fused quartz, calcium aluminate glass, lithium niobate, calcite, titanium oxide, strontium titanate, alumina, lithium fluoride, yttrium oxide, magnesium oxide, zirconia, magnesium fluoride, calcium fluoride, sodium fluoride, barium fluoride, lead fluoride, sodium iodide, sodium chloride, potassium chloride, silver chloride, thallium chloride, thallium bromide, potassium bromide, silver bromide, thallium bromide, potassium iodide, cesium bromide, cesium iodide, or the like, and a phosphor; (iiib) a plate-shaped article formed of a mixture of a transparent inorganic substance, such as oxide glass including quartz glass, soda lime glass, and optical glass, fluoride glass, chalcogen glass, or the like, and a phosphor; and (iv) a plate-shaped article obtained by firing phosphor powder, such as YAG (yttrium aluminum garnet), TAG (terbium aluminum garnet), silicate phosphor, sialon phosphor, or the like.

The light wavelength conversion member may be provided on at least one of the light emitting element. Alternatively, the light emitting element may be provided on each of a plurality of the light emitting elements. Alternatively, the light wavelength conversion member may be provided integrally with a plurality of the light emitting elements. When the light wavelength conversion member is provided integrally with a plurality of the light emitting elements, the thickness of the light wavelength conversion member may not be uniform. For example, when one light wavelength conversion member is arranged so as to face a plurality of the light emitting elements, the thickness of a portion of the light wavelength conversion member may be made small, the portion facing the gap region between the light emitting elements.

[Filter Layer]

As the aforementioned filter layer 46, a so-called optical thin film, which is appropriately designed so as to selectively transmit the light having a desired wavelength, is preferable. The filter layer 46 functions, for example, as a dichroic mirror that is multi-layered by laminating, one on another, materials each having a refractive index different from those of the others. Each layer that forms the filter layer 46 is formed by deposition or sputtering. The filter layer 46 according to the present embodiment is provided so as to transmit blue light and reflect yellow light. It is needless to say that the filter layer 46 is not limited to what has been described above, and, for example, a long-pass filter, a short-pass filter, or a band-pass filter may be adopted. The filter layer 46 formed by such an optical thin film is formed on the optically polished surface of the plate-shaped phosphor layer 44. Of course, it is also possible that the filter layer 46 is formed on a roughened surface or a concavo-convex surface.

With the filter layer 46, the light emitting module 40 according to the present embodiment transmits the light emitted from the LED chip 42 and reflects the light whose wavelength has been converted by the phosphor layer 44, and hence the efficiency of extracting light in the front direction is improved. Further, the light distribution of the LED chip 42 relatively concentrates in front and the phosphor layer 44 provided so as to face the light emitting surface 42a of the LED chip 42 is plate-shaped, and hence the emitted light from the LED chip 42 and the converted light whose wavelength has been converted by the phosphor layer 44 are both likely to travel in the front direction. Accordingly, the luminance in the front direction of the light emitting module 40 can be particularly enhanced.

A band-pass filter can be formed by combining dielectric thin films. A dielectric thin film can be produced by using various publicly-known methods. Examples of such methods include, for example: an air doctor coater, blade coater, rod coater, knife coater, reverse roll coater, transfer coater, gravure coater, kiss coater, casting coating, spray coating, slot orifice coater, calender coating, electrodeposition coating, extrusion coating, spin coating, vacuum plating method, etc.

A band-pass filter can be produced by combining a dielectric thin film having a low refractive index and that having a high refractive index. Examples of a substance by which a dielectric having a low refractive index can be achieved include, for example: CaF (refractive index 1.23), LiF (refractive index 1.36), $MgF_2$ (refractive index 1.38), $SiO_2$ (refractive index 1.46), and LaF3 (refractive index 1.59). Examples of a substance by which a dielectric having a high refractive index can be achieved include: $NdF_3$ (refractive index 1.60), $Al_2O_3$ (refractive index 1.63), $CeF_3$ (refractive index 1.63), MgO (refractive index 1.70), $BiF_3$ (refractive index 1.74), $PbF_2$ (refractive index 1.75), BeO (refractive index 1.82), $Sc_2O_3$ (refractive index 1.86), $Pr_6O_{11}$ (refractive index 1.92), $La_2O3$ (refractive index 1.95), $Nd_2O_3$ (refractive index 2.00), $HfO_2$ (refractive index 2.09), $CeO_2$ (refractive index 2.20), $ZrO_2$ (refractive index 2.03), OH-5 ($ZrO_2+TiO_2$: refractive index 2.09), $Ta_2O_5$ (refractive index 2.14), OS-50 ($Ti_3O_5$: refractive index 2.24), $Sb_2O_3$ (refractive index 2.29), and $PbCl_2$ (refractive index 2.30).

The outermost layer of the light incident surface of the filter layer may be a dielectric thin film having a high refractive index or that having a low refractive index. A substance having a high film hardness, such as $SiO_2$, is preferable from the viewpoint of durability.

(Second Embodiment)

Figure 6:
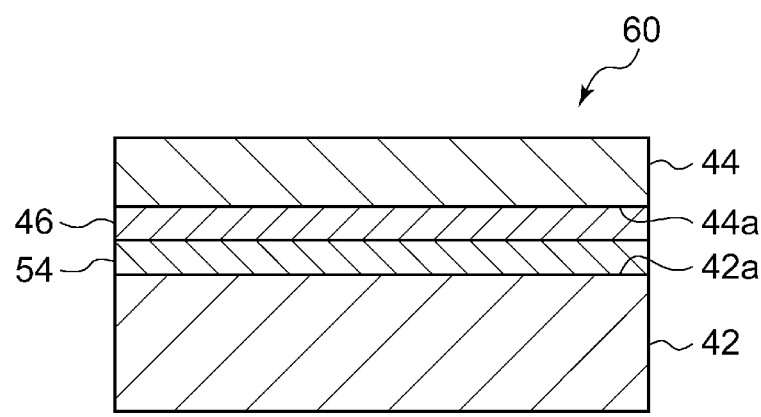
FIG. 6 is a sectional view illustrating an essential portion of a light emitting module according to Second Embodiment.

FIG. 6 is a sectional view illustrating an essential portion of a light emitting module according to Second Embodiment. A light emitting module 60 according to the present embodiment is very different from the light emitting module according to First Embodiment in that the light emitting module 60 further comprises an adhesive layer 54 that adheres the filter layer 46 and the LED chip 42. The adhesive layer 54 is formed of a translucent material having a refractive index of 1.3 or more. Specifically, a fluorine adhesive, dimethyl silicone, bisphenol A epoxy, and $TiO_2$ sol-gel agent, etc., are preferable.

When the gap between the filter layer 46 and the LED chip 42 is formed of the air layer 48, as in the light emitting module according to First Embodiment, the difference between the refractive index of the air layer 48 and that of the LED chip 42 is relatively large, and hence there is room for improving the efficiency of extracting the light in the LED chip 42. Accordingly, by adhering the filter layer 46 and the LED chip 42 with the adhesive layer 54 having a refractive index higher than that of air, the efficiency of extracting the light in the LED chip 42 can be improved. As a result, the luminance of the light emitting module can also be enhanced.

In the light emitting module according to each of the aforementioned embodiments, the filter layer 46 is formed, of the surfaces of the phosphor layer 44, only on the surface 44a that faces the LED chip 42, but a place where the filter layer is formed is not limited to this structure. For example, the filter layer may be formed, of the surfaces of the phosphor layer 44, only on the side surface or on both the side surface and the surface 44a that faces the LED chip 42. When the filter layer 46 is formed on the side surface, the filter layer may be formed on part of the side surfaces, not on all of the side surface, in view of an effect of improving a luminance and easiness in production.

Figure 7:
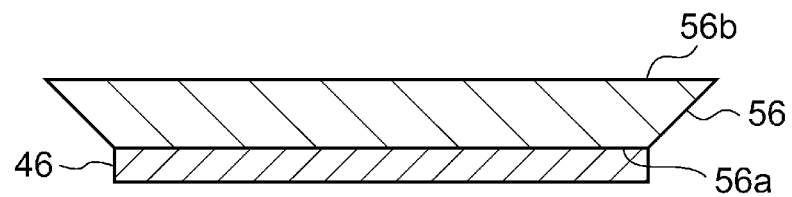
FIG. 7 is a sectional view illustrating a phosphor layer whose side surface has a tapered shape.

The phosphor layer 44 according to each of the aforementioned embodiments may be a rectangular parallelepiped, or the side surface of the rectangular parallelepiped may have a tapered shape. FIG. 7 is a sectional view illustrating a phosphor layer 56 whose side surface has a tapered shape. The tapered shape is formed so as to spread from the light incident surface 56a of the phosphor layer 56 toward the light emitting surface 56b. By forming the side surface to have such a tapered shape, it becomes difficult that the light transmitted through the filter layer 46 is emitted from the side surface, thereby allowing the luminous flux of the light emitted from the light emitting surface 56b, which is located in front of the phosphor layer 56, to be increased.

Further, an antireflection film may be formed, of the surfaces of the phosphor layers 44 and 56, on the surface on which the filter layer 46 is not formed; or roughening processing or concavo-convex processing may be performed on the surface. An example of the antireflection film includes, for example, a film that is obtained by mirror polishing the light emitting surface of the phosphor layer and then by forming a dielectric multi-layer film. In addition, an example of the roughening processing performed on the surface includes, for example, a process in which the surface on which the filter layer is not formed is processed with a polishing machine such that the arithmetic average roughness Ra in at least part of the surface becomes 10 nm to 1000 nm. It is preferable that the roughening processing is performed on the surface such that the arithmetic average roughness Ra becomes 100 nm or more. In addition, an example of the concavo-convex processing includes, for example, a process in which a plurality of grooves are formed, with a dicer, on the surface on which the filter layer is not formed. The line width of the groove to be formed is approximately 1 μm to 1000 μm and the depth thereof is approximately 1 μm to 1000 μm. Thus, by forming an antireflection film on the surface of the phosphor layer or by processing the surface, the light extraction efficiency on the light emitting surface of the phosphor layer is further improved.

Alternatively, as the concavo-convex processing, laser processing, blast processing, dry etching processing, wet etching processing, or the like may be appropriately adopted, other than the grinding processing with the use of a dicer.

Subsequently, the property of a further preferable filter will be described, taking, as an example, a white light emitting module in which a blue light emitting LED chip and a yellow luminescent phosphor are combined. When the filter layer 46 is a multi-layer film and when light is incident obliquely, a transmission/reflection property is generally shifted in the short-wavelength direction (in comparison with the case where light is incident perpendicularly). That is, in comparison with the wavelength at which a transmittance (or a reflectance) is rapidly changed when light is incident perpendicularly on the filter layer, the wavelength, at which a transmittance (or a reflectance) is rapidly changed when light is incident obliquely on the filter layer, is shifted to the short-wavelength side.

Figure 8:
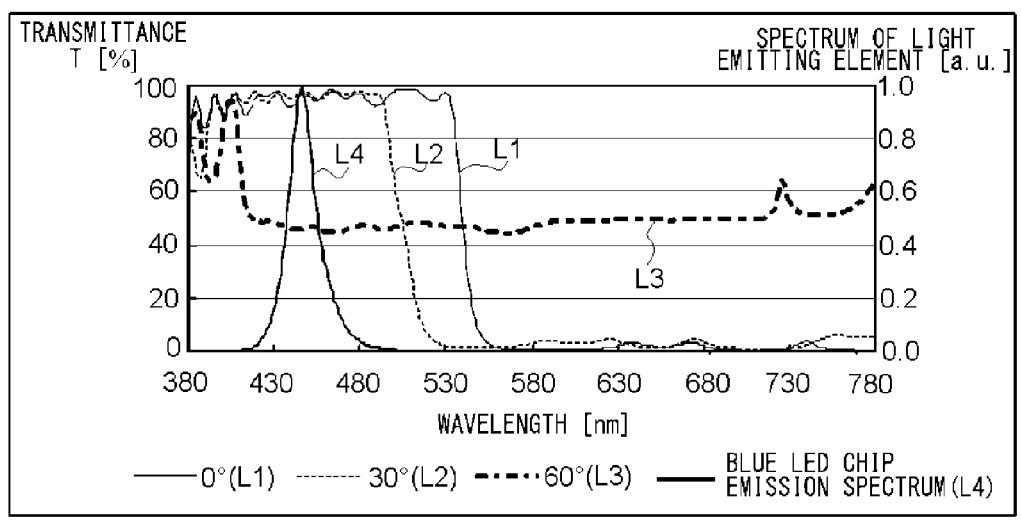
FIG. 8 is a graph illustrating the transmittance of a conventional filter layer.
Figure 9:
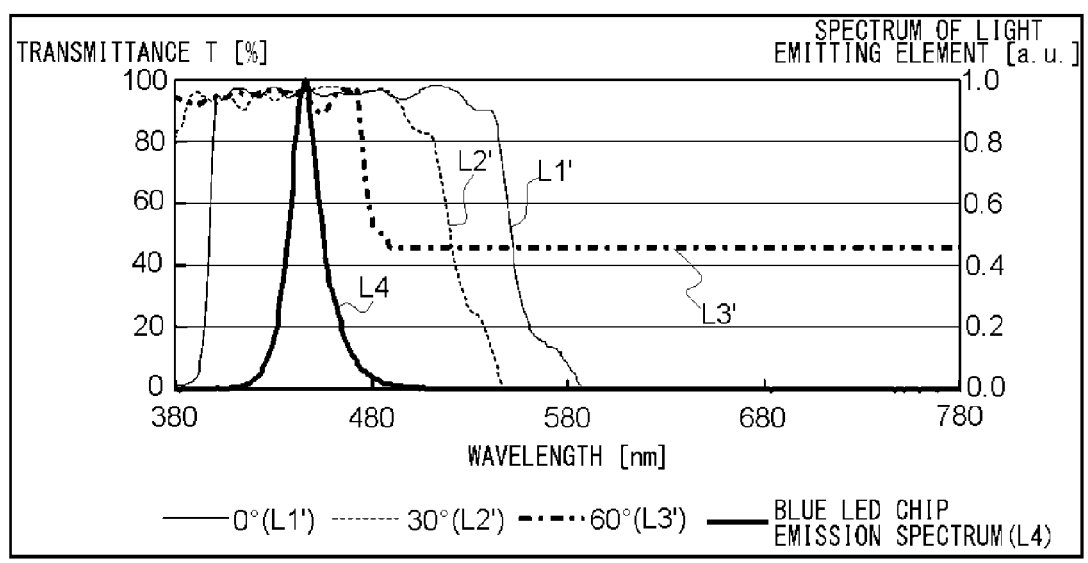
FIG. 9 is a graph illustrating the transmittance of a filter layer according to the present embodiment.
Figure 10:
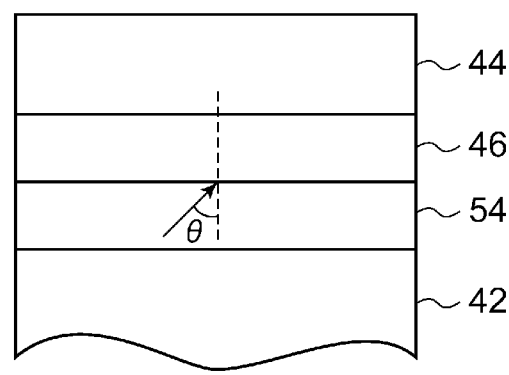
FIG. 10 is a schematic view illustrating the definition of an incident angle.

FIG. 8 is a graph illustrating the transmittance of a conventional filter layer. FIG. 9 is a graph illustrating the transmittance of the filter layer according to the present embodiment. FIG. 10 is a schematic view illustrating the definition of an incident angle. Each of FIGS. 8 and 9 illustrates the transmittance T occurring when the light (wavelength: 420 to 480 nm) emitted from the LED chip 42 is incident on the filter layer 46 from the adhesive layer 54 having a refractive index of 1.4 at the incident angle θ illustrated in FIG. 10 (θ: 0, 30, 60°).

In the filter layer illustrated in FIG. 8, the wavelength band where the transmittance is high is more shifted to the short-wavelength side as the incident angle θ becomes larger. In particular, when the incident angle is 60°, the transmittance T in the wavelength band of the emission spectrum of a blue LED chip is decreased to 46%. Accordingly, of the light emitted by the blue LED chip, most of the light to be incident on the filter layer 46 particularly at a large incident angle is reflected, and hence an amount of the light reaching the phosphor layer is decreased. As a result, there is room for further improvement from the viewpoint of more effectively utilizing the light emitted by the blue LED chip.

Then, the filter layer having the property illustrated in FIG. 9 has been considered. Even in the filter layer illustrated in FIG. 9, it is the same as in the filter layer illustrated in FIG. 8 that the wavelength band where the transmittance is high is more shifted to the short-wavelength side as the incident angle θ becomes larger. However, the filter layer illustrated in FIG. 9 is formed such that, in view that the wavelength band where the transmittance is high is more shifted to the short-wavelength side as the incident angle θ becomes larger, the transmission/reflection property at the incident angle of 0° (Line L1' illustrated in FIG. 9) is shifted by 15 nm to the long-wavelength side with respect to the transmission/reflection property of the conventional filter layer at the incident angle of 0° (Line L1 illustrated in FIG. 8).

Figure 11:
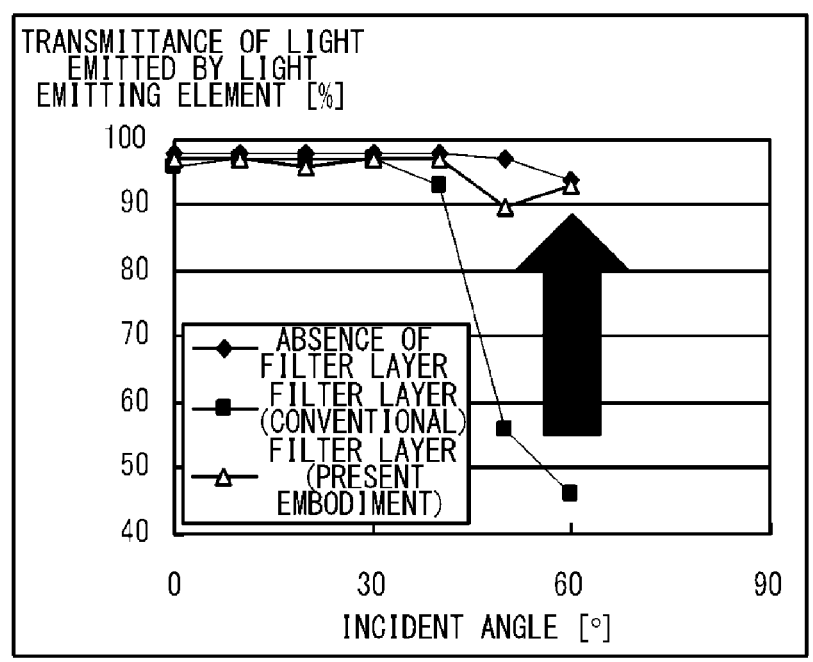
FIG. 11 is a graph illustrating the incident angle dependence of the transmittance of the light emitted by a light emitting element, depending on presence or absence of a filter layer and a type of the filter layer.

FIG. 11 is a graph illustrating the incident angle dependence of the transmittance of the light emitted by a light emitting element, depending on presence or absence of a filter layer and a type of the filter layer. The transmittance has been calculated with respect to the light travelling from an adhesive layer having a refractive index of 1.4 toward a filter layer. As illustrated in FIG. 11, in the filter layer according to the present embodiment, the transmittance in the filter layer becomes 90% or more, even when the light emitted by the LED chip reaches the filter layer at an incident angle of 60°.

The transmittance of the light emitted by the LED chip, occurring when an incident angle is 60° or more, can be improved by making the shift amount to be further large. On the other hand, the reflection performance, occurring at an incident angle of 0°, is decreased, because the wavelength band where the transmittance is high is overlapped with part of the fluorescence wavelength band (490 nm to 780 nm). Accordingly, in order to maximize a light extraction efficiency, the present inventors have found that, in view of the balance among the directivity of the light distribution of an LED chip, the wavelength of the light emitted by the LED chip, and the fluorescence wavelength, a filter layer that more transmits, of the light emitted by the LED chip, the light within a range of an incident angle with respect to a filter layer of ±60° (corresponding to approximately 90% of the total energy of the light emitted by the LED chip), is preferable.

Alternatively, the filter layer may be formed such that, when the light emitted by the semiconductor light emitting element is incident on the filter layer at an incident angle of 60°, the transmittance is 80% or more. Thereby, it becomes possible to guide, to the phosphor layer, most of the light emitted in the front direction from the semiconductor light emitting element.

In addition, when it is assumed that: the wavelength of light, occurring when the transmittance becomes 50% in the case where the light is incident on the filter layer 46 at an incident angle of 0° (when a plurality of wavelengths are present, a larger wavelength), is $\lambda 1$ [nm]; and the peak wavelength of the light emitted by the LED chip 42 is $\lambda p$ [nm], the filter layer according to the present embodiment is formed so as to satisfy $\lambda p \leq \lambda 1 \leq \lambda p + 200$ [nm]. Specifically, in the embodiment, the peak wavelength $\lambda p$ of the light emitted by the LED chip 42 is approximately 450 nm, and the wavelength $\lambda 1$ of light, occurring when the transmittance becomes 50% in the case where the light is incident on the filter layer 46 at an incident angle of 0°, is approximately 550 nm, and accordingly the relationship represented by the aforementioned expression is satisfied.

If the wavelength $\lambda 1$ of light at which the transmittance becomes 50% is smaller than the peak wavelength $\lambda p$ the LED chip 42, most of the light emitted from the LED chip 42 is not transmitted through the filter layer 46, and hence the light reaching the phosphor layer 44 is decreased. On the other hand, if the wavelength $\lambda 1$ of light at which the transmittance becomes 50% is larger than $\lambda p+200$ nm (wherein, $\lambda p$: peak wavelength of the light emitted by the LED chip 42), the light travelling toward the filter layer 46, of the light whose wavelength has been converted by the phosphor layer 44, is not sufficiently reflected on the filter layer 46, and hence the light that has not been reflected travels toward the LED chip 42 as it is, and is turned into heat in the meantime. Accordingly, by forming the filter layer 46 so as to satisfy $\lambda p \leq \lambda 1 \leq \lambda p + 200$ [nm], occurrence of the light that does not contribute to the light emission of the light emitting module and becomes a waste, can be suppressed. It is preferable to form the filter layer 46 so as to satisfy $\lambda p+50$ [nm] $\leq \lambda 1 \leq \lambda p+200$ [nm]. It is more preferable to form the filter layer 46 so as to satisfy $\lambda p+100$ [nm] $\leq \lambda 1 \leq \lambda p+150$ [nm].

In each of the aforementioned embodiments, the filter layer 46 may be set at any place, as long as being located on the axis of the light emitted by the LED chip 42. For example, the filter layer 46 may be formed immediately above the light emitting layer in the LED chip or immediately above the LED chip. It is preferable that the filter layer is set near to the light incident surface of the phosphor layer 44, thereby allowing the light whose wavelength has been converted to be efficiently reflected in the phosphor layer 44.

Hereinafter, the luminance of a light emitting module in which the aforementioned various structures are combined will be described with reference to each example.

EXAMPLES

Examples 1-1 to 1-3

In the present examples, the luminances, occurring depending on the types of a semiconductor light emitting element in the light emitting module illustrated in FIG. 3 or FIG. 4, will be compared with each other. In a light emitting module according to Comparative Example 1, a semiconductor light emitting element is a flip-chip (FC) type LED, and a filter layer is not provided. In a light emitting module according to Example 1-1, a semiconductor light emitting element is an FC type LED, and a filter layer is provided. In a light emitting module according to Example 1-2, a semiconductor light emitting element is a vertical (VC) LED, and a filter layer is provided. In a light emitting module according to example 1-3, a semiconductor light emitting element is an LD, and a filter layer is provided. A phosphor layer in the light emitting module according to each of Comparative Example and Examples is formed of a glass composition in which powder phosphors are dispersed and the thickness thereof is 150 μm.

In Table 1, the structure and luminance of the light emitting module according to each of Comparative Example 1 and Examples 1-1 to 1-3 are summarized.

TABLE 1

|  |  | COMPARATIVE EXAMPLE 1 | EXAMPLE 1-1 | EXAMPLE 1-2 | EXAMPLE 1-3 |
| --- | --- | --- | --- | --- | --- |
| TYPE OF LIGHT EMITTING ELEMENT |  | FC | FC | VC | LD |
| FILTER LAYER |  | ABSENCE | PRESENCE (BOTTOM) | PRESENCE (BOTTOM) | PRESENCE (BOTTOM) |
| PHOSPHOR LAYER | MATERIAL | GLASS | GLASS | GLASS | GLASS |
|  | THICKNESS [μm] | 150 | 150 | 150 | 150 |
| LUMINANCE |  | 100 | 105 | 110 | 120 |

As shown in Examples 1-1 to 1-3, the luminance is improved by providing a filter layer in comparison with Comparative Example. In particular, in the light emitting module according to Example 1-3 provided with an LD having high directivity, the luminance is improved by 20% in comparison with that of the light emitting module according to Comparative Example 1.

Example 2-1, Example 2-2

In the present examples, it will be studied whether it is preferable which surface of a phosphor layer a film layer is formed on. In a light emitting module according to Example 2-1, a film layer is formed only on the side surface of a phosphor layer. In a light emitting module according to Example 2-2, a filter layer is formed on the side surface and the bottom of a phosphor layer. Other structures are the same as those in Comparative Example 1 and Example 1-1.

In Table 2, the structure and luminance of the light emitting module according to each of Comparative Example 1 and Examples 1-1, 2-1, and 2-2 are summarized.

TABLE 2

| | | COMPARATIVE EXAMPLE 1 | EXAMPLE 1-1 | EXAMPLE 2-1 | EXAMPLE 2-2 |
|---|---|---|---|---|---|
| TYPE OF LIGHT EMITTING ELEMENT | | FC | FC | FC | FC |
| FILTER LAYER | | ABSENCE | PRESENCE (BOTTOM) | PRESENCE (SIDE SURFACE) | PRESENCE (BOTTOM + SIDE SURFACE) |
| PHOSPHOR LAYER | MATERIAL | GLASS | GLASS | GLASS | GLASS |
| | THICKNESS [μm] | 150 | 150 | 150 | 150 |
| LUMINANCE | | 100 | 105 | 103 | 108 |

As shown in Examples 1-1, 2-1, and 2-2, the luminance of a light emitting module is improved by forming a filter layer on the surface of a phosphor layer. Further, as shown in Example 2-2, the fluorescence travelling from the phosphor layer toward an LED chip can be suppressed and the light emitted outside from the side surface of the phosphor layer can be suppressed, by providing the filter layer on the surface (bottom) of the phosphor layer, located on the side that faces the LED chip, and the side surface of the phosphor layer; and hence the luminance of the light emitting module is further improved.

Example 3-1, Example 3-2

In the present examples, the type of a phosphor layer will be studied. A light emitting module according to Example 3-1 includes a resin plate phosphor layer in which powder phosphors are dispersed in bisphenol A epoxy. A light emitting module according to Example 3-2 includes a ceramic phosphor layer obtained by sintering phosphors. A light emitting module according to Comparative Example 3-1 includes a resin film phosphor layer in which powder phosphors are dispersed in a dimethyl silicone resin. A light emitting module according to Comparative Example 3-2 includes a resin plate phosphor layer according to Example 3-1, but a filter layer is not formed.

In Table 3, the structure and luminance of the light emitting module according to each of Comparative Examples 3-1 and 3-2 and Examples 3-1 and 3-2 are summarized.

As shown in Examples 3-1 and 3-2, the luminance of a light emitting module is improved by including a plate-shaped phosphor layer. In particular, in the light emitting module according to Example 3-2 including a plate-shaped ceramic phosphor layer, the luminance is improved by 16% in comparison with that of the light emitting module according to Comparative Example 1. The hardness of the phosphor layer according to Comparative Example 3-1 is insufficient because it is formed of a resin film, and hence the shape of the film is likely to be deformed by external force occurring while being processed. Accordingly, there is caused the problem that a crack may be caused in the film or a deposited filter layer may be peeled off while being processed, and hence the luminance was not able to be measured precisely.

Examples 4-1 to 4-4

In the present examples, a difference in the refractive indices of translucent adhesive layers will be studied. A light emitting module according to Example 4-1 includes an adhesive layer formed of a fluorine adhesive (refractive index n=1.34). A light emitting module according to Example 4-2 includes an adhesive layer formed of dimethyl silicone (n=1.41). A light emitting module according to Example 4-3 includes an adhesive layer formed of bisphenol A epoxy (n=1.55). A light emitting module according to Example 4-4 includes an adhesive layer formed of a $TiO_2$ sol-gel agent (refractive index n=1.60). Other structures are the same as those in Example 3-2.

In Table 4, the structure and luminance of the light emitting module according to each of Examples 4-1 to 4-4 are summarized.

TABLE 3

| | | COMPARATIVE EXAMPLE 3-1 | COMPARATIVE EXAMPLE 3-2 | EXAMPLE 3-1 | EXAMPLE 3-2 |
|---|---|---|---|---|---|
| TYPE OF LIGHT EMITTING ELEMENT | | FC | FC | FC | FC |
| FILTER LAYER | | PRESENCE (BOTTOM) | ABSENCE | PRESENCE (BOTTOM) | PRESENCE (BOTTOM) |
| PHOSPHOR LAYER | MATERIAL | RESIN FILM | RESIN PLATE | RESIN PLATE | CERAMIC |
| | THICKNESS [μm] | 150 | 150 | 150 | 150 |
| LUMINANCE | | INCAPABLE MEASUREMENT | 98 | 101 | 116 |

TABLE 4

|  |  | EXAMPLE 4-1 | EXAMPLE 4-2 | EXAMPLE 4-3 | EXAMPLE 4-4 |
| --- | --- | --- | --- | --- | --- |
| TYPE OF LIGHT EMITTING ELEMENT |  | FC | FC | FC | FC |
| FILTER LAYER |  | PRESENCE (BOTTOM) | PRESENCE (BOTTOM) | PRESENCE (BOTTOM) | PRESENCE (BOTTOM) |
| PHOSPHOR LAYER | MATERIAL | CERAMIC | CERAMIC | CERAMIC | CERAMIC |
|  | THICKNESS [μm] | 150 | 150 | 150 | 150 |
| ADHESIVE LAYER | REFRACTIVE INDEX n | 1.34 | 1.41 | 1.55 | 1.6 |
| LUMINANCE |  | 137 | 145 | 155 | 160 |

As shown in Examples 4-1 to 4-4, the luminance of a light emitting module is drastically improved by adhering a semiconductor light emitting element and a filter layer with the adhesive layer. In particular, in a light emitting module including an adhesive layer having a refractive index of 1.3 or more, the luminance is improved by 40% or more in comparison with that of the light emitting module according to Comparative Example 1. A luminance is more improved in a light emitting module including an adhesive layer having a higher refractive index. This can be considered as follows: when a semiconductor light emitting element is a flip-chip type LED chip, the light emitting surface thereof is mostly formed of sapphire having a refractive index of approximately 1.78, and hence an efficiency of extracting light from the LED chip is improved by using an adhesive layer having a refractive index closer to the refractive index.

It is preferable that the thickness of the adhesive layer is within a range of 0.1 μm to 100 μm. When the thickness thereof is 0.1 μm or more, the filter layer and the semiconductor light emitting element can be adhered together. Further when the thickness thereof is 100 μm or less, the light emitted from the semiconductor light emitting element can reach the filter layer without spreading too much, and a decrease in the transmittance can also be suppressed.

Example 5

In the present example, an effect, occurring when an antireflection film is formed on the light emitting surface of a phosphor layer, will be studied. In a light emitting module according to Example 5, an antireflection layer formed of a dielectric multi-layer film is coated on the light emitting surface of the phosphor layer.

In Table 5, the structure and luminance of the light emitting module according to each of Examples 4-2 and 5 are summarized.

As shown in Example 5, an efficiency of extracting light from the phosphor layer is improved by forming the antireflection film on the light emitting surface of the phosphor layer, and the luminance of the light emitting module is improved.

Examples 6-1 to 6-6

Figure 12:
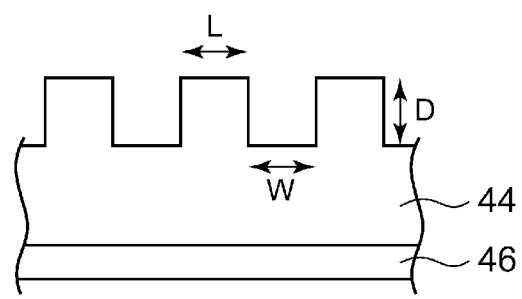
FIG. 12 is a sectional view of an essential portion, illustrating a concavo-convex shape on the light emitting surface of a phosphor layer formed by groove-processing.

In the present examples, an effect of performing concavo-convex (groove) processing on the light emitting surface of a phosphor layer will be studied. FIG. 12 is a sectional view of an essential portion, illustrating a concavo-convex shape on the light emitting surface of a phosphor layer formed by groove-processing. As illustrated in FIG. 12, the phosphor layer 44 has a groove shape in at least part of the surface thereof on which the filter layer 46 is not formed. The parameters defining the groove shape include a groove width W, a groove depth D, and a space L that is the width of the unprocessed portion between the grooves. Each of the phosphor layers in Examples 6-1 to 6-5 is processed such that the groove depth D with respect to the thickness of the phosphor layer becomes 90%, and the groove depth D is different from those of the others within a range of 45 μm to 450 μm. All of the groove widths W and the spaces L are 100 μm. The light emitting module in Example 6-6 is the same as that in Example 4-2, except that it does not include a filter layer.

In Table 6, the structure and luminance of the light emitting module according to each of Examples 4-2, and 6-1 to 6-6 are summarized. Herein, the numeric values in the parentheses of the luminance columns in the table represent luminances when the filter layer is not provided.

TABLE 5

|  |  | EXAMPLE 4-2 | EXAMPLE 5 |
| --- | --- | --- | --- |
| TYPE OF LIGHT EMITTING ELEMENT |  | FC | FC |
| FILTER LAYER |  | PRESENCE (BOTTOM) | PRESENCE (BOTTOM) |
| PHOSPHOR LAYER | MATERIAL | CERAMIC | CERAMIC |
|  | THICKNESS [μm] | 150 | 150 |
|  | LIGHT EMITTING SURFACE | ABSENCE OF ANTIREFLECTION FILM | PRESENCE OF ANTIREFLECTION FILM |
| ADHESIVE LAYER | REFRACTIVE INDEX n | 1.41 | 1.41 |
| LUMINANCE |  | 145 | 160 |

TABLE 6

|  |  | EXAMPLE 6-1 | EXAMPLE 6-2 | EXAMPLE 6-3 | EXAMPLE 6-4 | EXAMPLE 6-5 | EXAMPLE 4-2 | EXAMPLE 6-6 |
|---|---|---|---|---|---|---|---|---|
| TYPE OF LIGHT EMITTING ELEMENT |  | FC | FC | FC | FC | FC | FC | FC |
| FILTER LAYER |  | PRESENCE (ABSENCE) | PRESENCE (ABSENCE) | PRESENCE (ABSENCE) | PRESENCE (ABSENCE) | PRESENCE (ABSENCE) | PRESENCE | ABSENCE |
| PHOSPHOR LAYER | MATERIAL | CERAMIC | CERAMIC | CERAMIC | CERAMIC | CERAMIC | CERAMIC | CERAMIC |
|  | THICKNESS [µm] | 50 | 100 | 150 | 275 | 500 | 150 | 150 |
|  | GROOVE DEPTH [µm] | 45 | 90 | 135 | 225 | 450 | ABSENCE | ABSENCE |
| ADHESIVE LAYER | REFRACTIVE INDEX n | 1.41 | 1.41 | 1.41 | 1.41 | 1.41 | 1.41 | 1.41 |
| LUMINANCE |  | 333(267) | 278(232) | 221(193) | 142(129) | 110(81) | 145 | 138 |

As shown in Examples 6-1 to 6-5, by providing a groove on the light emitting surface of the phosphor layer, an efficiency of extracting light from the light emitting surface thereof is improved and the luminance of a light emitting module is improved. Further, when the ratio of the groove depth D to the thickness of the phosphor layer is constant, the luminance of the light emitting module becomes higher as the groove depth is smaller, and the ratio of the improvement in the luminance also becomes higher when a filter layer is provided. In particular, in the light emitting module according to an example in which the thickness of the phosphor layer is 150 µm or less, the luminance is improved by 100% or more in comparison with that of the light emitting module according to Comparative Example 1.

When the light emitting modules according to Examples 4-2 and 6-6 in each of which the thickness of the phosphor layer is 150 µm and a groove is not provided, the relative luminance of the light emitting module according to Example 4-2 in which a filter layer is provided is 145, while that of the light emitting module according to Example 6-6 in which a filter layer is not provided 138. That is, an effect of providing a filter layer on a phosphor layer on which groove processing has not been performed is approximately 5% (138→145).

When Example 6-3 in which the thickness of the ceramic phosphor layer is 150 µm and groove processing has not been performed is observed, the relative luminance of the light emitting module in which a filter layer is provided is 221, while that of the light emitting module in which a filter layer is not provided is 193. That is, an effect of providing a filter layer on the phosphor layer on which groove processing has been performed is approximately 14% (193→221). That is, it can be known that, by forming a filter layer on the phosphor layer and by performing groove processing on the light emitting surface of the phosphor layer, the luminance of the light emitting module is more improved by a synergistic effect.

Such a difference between the effects of improving luminance, occurring depending on presence or absence of groove processing, can be considered as follows. When groove processing has not been performed on the light emitting surface of a phosphor layer, the light reflected, by a filter layer, in the light emitting surface direction, of the light whose wavelength has been converted by the phosphor layer, is likely to be reflected again on the light emitting surface in the plate-shaped phosphor layer, and the light is repeatedly reflected in the phosphor layer and finally turned into heat. It can be considered that, thereby, the light reflected by the filter layer cannot be efficiently extracted outside the phosphor layer. On the other hand, when groove processing has been performed on the light emitting surface of a phosphor layer, it can be consider that: it becomes possible to efficiently extract, outside the phosphor layer, the light reflected by a filter layer, and hence a further improvement in the luminance of a light emitting module is achieved.

Examples 7-1 to 7-4

Also in the present examples, an effect of performing concavo-convex (groove) processing on the light emitting surface of a phosphor layer will be studied. Each of the phosphor layers in Examples 7-1 to 7-4 is processed such that the groove depth D is different from those of the others, while the thickness of the phosphor layer is constant, and the groove depth D varies within a range of 3 µm to 100 µm. All of the groove widths W and the spaces L are 100 µm.

In Table 7, the structure and luminance of the light emitting module according to each of Examples 7-1 to 7-4 are summarized. Herein, the numeric values in the parentheses of the luminance columns in the table represent luminances when the filter layer is not provided.

TABLE 7

|  |  | EXAMPLE 7-1 | EXAMPLE 7-2 | EXAMPLE 7-3 | EXAMPLE 7-4 |
|---|---|---|---|---|---|
| TYPE OF LIGHT EMITTING ELEMENT |  | FC | FC | FC | FC |
| FILTER LAYER |  | PRESENCE (ABSENCE) | PRESENCE (ABSENCE) | PRESENCE (ABSENCE) | PRESENCE (ABSENCE) |
| PHOSPHOR LAYER | MATERIAL | CERAMIC | CERAMIC | CERAMIC | CERAMIC |
|  | THICKNESS [µm] | 150 | 150 | 150 | 150 |
|  | GROOVE DEPTH [µm] | 3 | 25 | 50 | 100 |
| ADHESIVE LAYER | REFRACTIVE INDEX n | 1.41 | 1.41 | 1.41 | 1.41 |
| LUMINANCE |  | 213 (152) | 251 (179) | 342 (244) | 344 (246) |

As shown in Examples 7-1 to 7-4, by providing a groove on the light emitting surface of the phosphor layer, an efficiency of extracting light from the light emitting surface thereof is improved and the luminance of a light emitting module is improved. Further, the luminance of the light emitting module is more improved as the groove depth D is larger with respect to the phosphor layer having a constant thickness. In particular, when the groove depth D is 3 μm or more, the luminance is improved by 100% or more in comparison with that of the light emitting module according to Comparative Example 1.

Examples 8-1 to 8-4

In the present examples, an effect of performing roughening processing on the light emitting surface of a phosphor layer will be studied. In each of the phosphor layers according to Examples 8-1 to 8-4, the arithmetic average roughness on the light emitting surface thereof is different from those of the others within a range of 100 nm to 1000 nm.

In Table 8, the structure and luminance of the light emitting module according to each of Examples 8-1 to 8-4 are summarized.

[Composition Analysis]

For a composition analysis of each of the aforementioned films (layers), for example, an elemental analysis is performed by using an energy dispersive X-ray analyzer (XMA) while observing a section of a thin film with a scanning electron microscope (SEM), or the surface of the film is analyzed by using a photoelectron spectroscopy apparatus (XPS) or a SIMS (Secondary Ion Mass Spectrometer), etc., while etching the surface thereof with an ion beam. The thickness and material of each film are specified by such methods.

[Optical Simulation]

The optical property of an optical thin film can be specified by using a commercially available optical thin film design software (e.g., Essential Macleod). With such a thin film design software, a simulation of the spectral property of a multi-layer film can be performed from the refractive indices of the materials of the film and the thickness data of the film. At the same time, it is possible to reproduce a spectral property corresponding to the refractive index of an arbitrary adhesive resin and the incident angle of an incident beam.

The present invention has been described above based on the embodiments and examples. The embodiments and

TABLE 8

| | | EXAMPLE 8-1 | EXAMPLE 8-2 | EXAMPLE 8-3 | EXAMPLE 8-4 |
|---|---|---|---|---|---|
| TYPE OF LIGHT EMITTING ELEMENT | | FC | FC | FC | FC |
| FILTER LAYER | | PRESENCE | PRESENCE | PRESENCE | PRESENCE |
| PHOSPHOR LAYER | MATERIAL | CERAMIC | CERAMIC | CERAMIC | CERAMIC |
| | THICKNESS [μm] | 150 | 150 | 150 | 150 |
| | ARITHMETIC AVERAGE ROUGHNESS Ra [nm] | 100 | 400 | 700 | 1000 |
| ADHESIVE LAYER | REFRACTIVE INDEX n | 1.41 | 1.41 | 1.41 | 1.41 |
| LUMINANCE | | 228 | 302 | 331 | 302 |

As shown in Examples 8-1 to 8-4, by roughening the light emitting surface of a phosphor layer, an efficiency of extracting light from the light emitting surface thereof is improved and the luminance of a light emitting module is improved. Further, when the arithmetic average roughness on the light emitting surface is 100 nm to 1000 nm, the luminance is improved by 100% or more in comparison with that of the light emitting module according to Comparative Example 1. In particular, when the arithmetic average roughness is 400 nm to 1000 nm, the luminance is improved by 200% or more in comparison with that of the light emitting module according to Comparative Example 1.

In the light emitting modules according to the above embodiments and examples, the case where a single semiconductor light emitting element is provided have been mainly described. However, the semiconductor light emitting element included in the light emitting module is not limited to a single number, but a plurality of semiconductor light emitting elements may be included, depending on the application or the required property.

In such a case, when it is assumed that: the number of the semiconductor light emitting elements included in the light emitting module is N; the area of the light emitting surface of each of the semiconductor light emitting elements, the light emitting surface being located on the side that faces a filter layer, is S; and the area of the light incident surface of a phosphor layer, the incident surface being located on the side that faces the semiconductor light emitting element, is T, it is better to satisfy $S \leq T/N \leq 4 \times S$. Thereby, most of the light emitted from the semiconductor light emitting elements is incident on the phosphor layer.

examples are described for exemplary purposes only, and it can be readily understood by those skilled in the art that various modifications may be made by making various combinations of the aforementioned components or processes, which are also encompassed in the scope of the present invention.

A light emitting module in which a semiconductor light emitting element that emits blue light and a yellow phosphor are combined together has been described in the aforementioned embodiments; however, a light emitting module including: a semiconductor light emitting element that emits ultraviolet light; and a plurality phosphors that are excited by the ultraviolet light to emit red light, green light, and blue light, respectively, may be adopted. Alternatively, a light emitting module including both a semiconductor light emitting element that emits ultraviolet light and a phosphor that is excited by the ultraviolet light to emit emits blue light and yellow light. In addition, the light emitting module according to the present embodiments can also be used in lighting lamps, without being limited to automotive lamps.

Industrial Applicability

The light emitting module according to the present invention can be used in various lamps, for example, lighting lamps, displays, automotive lamps, and traffic lights, etc.

What is claimed is:
1. A light emitting module comprising:
a semiconductor light emitting element;
a plate-shaped light wavelength conversion member that is provided so as to face a light emitting surface of the semiconductor light emitting element and is configured to convert a wavelength of a light emitted by the semiconductor light emitting element;

a filter layer that is formed, of surfaces of the plate-shaped light wavelength conversion member, on at least one of the surfaces facing the semiconductor light emitting element and a side surface and is configured to transmit the emitted light emitted from the semiconductor light emitting element and to reflect light whose wavelength has been converted by the light wavelength conversion member; and an adhesive layer that adheres the filter layer and the semiconductor light emitting element, wherein the semiconductor light emitting element is formed such that a ratio of energy of the emitted light from the semiconductor light emitting element that is within a range of ±60° with respect to the front direction to a total energy of the emitted light is 80% or more, the filter layer is formed of the surfaces of the light wavelength conversion member, on the at least one of the surfaces that faces the semiconductor light emitting element, and the filter layer is formed such that a transmittance, occurring when the emitted light emitted by the semiconductor light emitting element is incident on the filter layer at an incident angle of 60°, is 80% or more, and the adhesive layer contains a material having a refractive index of 1.3 or more selected from the group consisting of: a fluorine adhesive, dimethyl silicone, bisphenol A epoxy, and $TiO_2$ sol-gel agent.

2. The light emitting module according to claim 1, wherein a thickness of the adhesive layer is 0.1 μm to 100 μm.

3. The light emitting module according to claim 1, wherein at least part of a surface of the light wavelength conversion member, on which the filter layer is not formed, has a concavo-convex shape.

4. The light emitting module according to claim 3, wherein the concavo-convex shape is formed of a plurality of grooves, and wherein a width of the grooves is 1 μm to 1000 μm and a depth thereof is 1 μm to 1000 μm.

5. The light emitting module according to claim 1, wherein an arithmetic average roughness Ra in at least part of a surface of the light wavelength conversion member, on which the filter layer is not formed, is 100 nm to 1000 nm.

6. The light emitting module according to claim 1, wherein when it is assumed that: a number of semiconductor light emitting elements included in the light emitting module is N; an area of a light emitting surface of each of said semiconductor light emitting elements, the light emitting surface being located on a side that faces the filter layer, is S; and an area of a light incident surface of the light wavelength conversion member, the light incident surface being located on a side that faces the semiconductor light emitting element, is T, $S \leq T/N \leq 4 \times S$ is satisfied.

7. The light emitting module according to claim 1, wherein a thickness of the light wavelength conversion member is 1 μm to 1000 μm.

8. The light emitting module according to claim 1, wherein when it is assumed that: a wavelength of light, occurring when the transmittance becomes 50% in a case where light is incident on the filter layer at an incident angle of 0°, is $\lambda 1$ [nm]; and a peak wavelength of light emitted by the semiconductor light emitting element is $\lambda p$ [nm], the filter layer is formed so as to satisfy $\lambda p \leq \lambda 1 \leq \lambda p+200$ [nm].

9. The light emitting module according to claim 2, wherein the filter layer is formed such that the transmittance, occurring when the light emitted by the semiconductor light emitting element is incident on the filter layer at an incident angle of 60°, is 80% or more.

10. The light emitting module according to claim 2, wherein at least part of a surface of the light wavelength conversion member, on which the filter layer is not formed, has a concavo-convex shape.

11. The light emitting module according to claim 2, wherein an arithmetic average roughness Ra in at least part of a surface of the light wavelength conversion member, on which the filter layer is not formed, is 100 nm to 1000 nm.

12. The light emitting module according to claim 2, wherein when it is assumed that: a number of semiconductor light emitting elements included in the light emitting module is N; an area of a light emitting surface of each of said semiconductor light emitting elements, the light emitting surface being located on a side that faces the filter layer, is S; and an area of a light incident surface of the light wavelength conversion member, the light incident surface being located on a side that faces the semiconductor light emitting element, is T, $S \leq T/N \leq 4 \times S$ is satisfied.

13. The light emitting module according to claim 2, wherein when it is assumed that: a wavelength of light, occurring when the transmittance becomes 50% in a case where light is incident on the filter layer at an incident angle of 0°, is $\lambda 1$ [nm]; and a peak wavelength of the light emitted by the semiconductor light emitting element is $\lambda p$ [nm], the filter layer is formed so as to satisfy $\lambda p \leq \lambda 1 \leq \lambda p+200$ [nm].

* * * * *